US006194366B1

United States Patent
Naghshineh et al.

(10) Patent No.: US 6,194,366 B1
(45) Date of Patent: Feb. 27, 2001

(54) POST CHEMICAL-MECHANICAL PLANARIZATION (CMP) CLEANING COMPOSITION

(75) Inventors: Shahriar Naghshineh, Allentown; Jeff Barnes, Bath; Yassaman Hashemi, Allentown; Ewa B. Oldak, Bethlehem, all of PA (US)

(73) Assignee: ESC, Inc., Bethlehem, PA (US)

(*) Notice: Subject to any disclaimer, the term of this patent is extended or adjusted under 35 U.S.C. 154(b) by 0 days.

(21) Appl. No.: 09/440,917

(22) Filed: Nov. 16, 1999

(51) Int. Cl.$^7$ ............................ C11D 7/26; C11D 7/32; C11D 3/30
(52) U.S. Cl. ............... 510/175; 510/176; 510/178; 510/245; 510/254; 510/477; 510/499; 510/504
(58) Field of Search ........................... 510/175, 176, 510/178, 245, 254, 499, 504, 577

(56) References Cited

U.S. PATENT DOCUMENTS

| | | | |
|---|---|---|---|
| 4,168,989 | 9/1979 | Edelman et al. | 134/28 |
| 4,294,729 | 10/1981 | Bakos et al. | 252/545 |
| 4,395,348 | 7/1983 | Lee | 252/143 |
| 4,487,708 | 12/1984 | Muccitelli | 252/178 |
| 4,610,953 | 9/1986 | Hashimoto et al. | 430/331 |
| 4,617,251 | 10/1986 | Sizensky | 430/256 |
| 4,744,834 | 5/1988 | Haq | 134/38 |
| 4,765,844 | 8/1988 | Merrem et al. | 134/38 |
| 4,770,713 | 9/1988 | Ward | 134/38 |
| 4,859,418 | 8/1989 | Ohlendorf et al. | 422/16 |
| 4,888,244 | 12/1989 | Masubuchi et al. | 428/416 |
| 5,091,103 | 2/1992 | Dean et al. | 252/162 |
| 5,185,235 | 2/1993 | Sato et al. | 430/331 |
| 5,190,723 | 3/1993 | Phillips et al. | 422/15 |
| 5,279,771 | 1/1994 | Lee | 252/548 |
| 5,308,745 | 5/1994 | Schwartzkopf | 430/329 |
| 5,334,332 | 8/1994 | Lee | 252/548 |
| 5,381,807 | 1/1995 | Lee | 134/2 |
| 5,407,788 | 4/1995 | Fang | 430/318 |
| 5,417,877 | 5/1995 | Ward | 252/156 |
| 5,419,779 | 5/1995 | Ward | 134/38 |
| 5,419,877 | 5/1995 | Goforth et al. | 422/177 |
| 5,466,389 | 11/1995 | Ilardi et al. | 252/156 |
| 5,476,606 | 12/1995 | Brancaleoni et al. | 252/79.1 |
| 5,482,566 | 1/1996 | Lee | 134/42 |
| 5,496,491 | 3/1996 | Ward et al. | 252/153 |
| 5,556,482 | 9/1996 | Ward et al. | 134/38 |
| 5,563,119 | * 10/1996 | Ward | 510/176 |
| 5,567,574 | * 10/1996 | Hasemi et al. | 430/331 |
| 5,597,420 | 1/1997 | Ward | 134/38 |
| 5,648,324 | 7/1997 | Honda et al. | 510/176 |
| 5,665,688 | 9/1997 | Honda et al. | 510/178 |
| 5,698,503 | 12/1997 | Ward et al. | 510/176 |
| 5,704,987 | 1/1998 | Huynh et al. | 134/6 |
| 5,707,947 | 1/1998 | Ward et al. | 510/176 |
| 5,709,756 | 1/1998 | Ward et al. | 134/1.3 |
| 5,753,601 | 5/1998 | Ward et al. | 510/176 |
| 5,756,398 | 5/1998 | Wang et al. | 438/692 |

(List continued on next page.)

FOREIGN PATENT DOCUMENTS 0 647 884 A1   6/1994   (EP).

OTHER PUBLICATIONS

Roy, et al., "Postchemical–Mechanical Planarization Cleanup Process for Inter Layer Dielectric Films", *J. Electrochem. Soc.*, 1:216–226 (Jan. 1995).

(List continued on next page.)

*Primary Examiner*—Gregory N. Del Cotto
(74) *Attorney, Agent, or Firm*—Ratner & Prestia

(57) ABSTRACT

A cleaning solution is provided for cleaning copper-containing microelectronic substrates, particularly for post-CMP or Via formation cleaning. The cleaning solution comprises a quaternary ammonium hydroxide, an organic amine, a corrosion inhibitor, and water. A preferred cleaning solution comprises tetramethylammonium hydroxide, monoethanolamine, gallic acid, and water. The pH of the cleaning solution is greater than 10.

9 Claims, 1 Drawing Sheet

U.S. PATENT DOCUMENTS

| | | | |
|---|---|---|---|
| 5,783,495 | 7/1998 | Li et al. | 438/738 |
| 5,846,921 | 12/1998 | Gil et al. | 510/175 |
| 5,855,811 | 1/1999 | Grieger et al. | 252/79.3 |
| 5,863,344 | 1/1999 | Nam | 134/1.3 |
| 5,922,136 | 7/1999 | Huang | 134/2 |
| 5,932,021 | 8/1999 | Cala et al. | 134/2 |
| 5,935,871 | 8/1999 | Farkas et al. | 438/693 |
| 5,988,186 | 11/1999 | Ward et al. | 134/1.3 |
| 5,997,658 * | 12/1999 | Peters et al. | 134/38 |

OTHER PUBLICATIONS

Pourbaix, Marcel, "Atlas of Electrochemical Equilibria in Aqueous Solutions", *National Assoc. of Corrosion Engineers*, Houston, Tx. pp. 70–83.

Huang et al., "Electrochemical Behavior of Copper in Tetramethyl Ammonium Hydroxide Based Solutions", *Symposium P, Proceedings of the Materials Research Society*, 566 (Apr. 5–7 (1999)).

Peters, L., "Clean Processing: A Host of Challenges for Copper CMP Cleaning", *Semiconductor International*, (Mar. 1998).

Hymes et al., "The challenges of the Cooper CMP Clean", *Semiconductor International*, (Jun. 1998).

* cited by examiner

US 6,194,366 B1

POST CHEMICAL-MECHANICAL PLANARIZATION (CMP) CLEANING COMPOSITION

FIELD OF THE INVENTION

The present invention relates generally to the field of post chemical-mechanical polishing (post-CMP) cleaning operations, and more specifically to post-CMP cleaning solutions for copper-containing microelectronic substrates.

BACKGROUND OF THE INVENTION

The present day fabrication of semiconductor devices is a complex, multi-step process. The CMP process is now a well established enabling technology used by most advanced semiconductor operations for planarization (or "polishing") of various substrates for production of devices with design geometries less than 0.35 micron.

The CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. In addition, the chemical slurry contains selected chemicals which etch various surfaces of the substrate during processing. The combination of mechanical and chemical removal of material during polishing results in superior planarization of the surface.

The CMP process, however, leaves contamination on the surfaces of the semiconductor substrate. This contamination is comprised of abrasive particles from the polishing slurry which may consist of alumina or silica, with reactive chemicals added to the polishing slurry. In addition, the contaminant layer may comprise reaction products of the polishing slurry and the polished surfaces. It is necessary to remove the contamination prior to subsequent processing of the semiconductor substrate in order to avoid degradation in device reliability and to avoid the introduction of defects which reduce the manufacturing process yield. Thus, post-CMP cleaning solutions have been developed to cleanse the substrate surface of CMP residuum.

Alkaline solutions based on ammonium hydroxide have been traditionally used in post-CMP cleaning applications. To date, most CMP applications have been directed to aluminum, tungsten, tantalum, and oxide-containing surfaces.

However, copper is increasingly becoming a material of choice in the production of interconnects in semiconductor fabrication. Copper is replacing aluminum as the metal of choice in such fabrication. Conventional post-CMP processes are inadequate for cleaning surfaces containing copper. Copper, copper oxide, and the slurry particles are the contaminants that exist on the copper-containing surface following this CMP process. The copper surface contamination diffuses quickly in silicon and silicon dioxide, and therefore, it must be removed from all wafer surfaces to prevent device failure.

Post-CMP cleaning solutions that are traditionally effective on alumina and silica-based CMP processes are not effective on copper-containing surfaces. Copper is easily damaged by these cleaning solutions. In addition, cleaning efficacy with the present post-CMP cleaning solutions has been proven unacceptable.

Nam, U.S. Pat. No. 5,863,344, discloses a cleaning solution for semiconductor devices containing tetramethyl ammonium hydroxide, acetic acid, and water. The solution preferably contains a volumetric ratio of acetic acid to tetramethyl ammonium hydroxide ranging from about 1 to about 50.

Ward, U.S. Pat. No. 5,597,420, discloses an aqueous stripping composition useful for cleaning organic and inorganic compounds from a substrate that will not corrode or dissolve metal circuitry in the substrate. The disclosed aqueous composition contains preferably 70 to 95 wt % monoethanolamine and a corrosion inhibitor at about 5 wt % such as catechol, pyrogallol or gallic acid.

Ward, U.S. Pat. No. 5,709,756, discloses a cleaning composition containing about 25 to 48 wt % hydroxylamine, 1 to 20 wt % ammonium fluoride, and water. The pH of the solution is greater that 8. The solution may further contain a corrosion inhibitor such as gallic acid, catechol, or pyrogallol.

Ilardi et al., U.S. Pat. No. 5,466,389, discloses an aqueous alkaline cleaning solution for cleaning microelectronic substrates. The cleaning solution contains a metal ion-free alkaline component such as a quaternary ammonium hydroxide (up to 25 wt %), a nonionic surfactant (up to 5 wt %), and a pH-adjusting component, such as acetic acid, to control the pH within the range of 8 to 10.

There is a need for a post-CMP cleaning composition for copper-containing surfaces. Such a post-CMP cleaning composition must effectuate substantial particle removal from the target surface and prevent or substantially lessen corrosion of the copper-containing substrate. Such a post-CMP cleaning composition must also refrain from attacking the process equipment used in the post-CMP process. Such a post-CMP cleaning composition should also be economical, work effectively through a wide temperature range, and preferably contain chemical components of comparatively lower toxicity. Such a post-CMP cleaning composition should also be useful in cleaning operations following CMP processes utilizing alumina or silica-based slurries.

SUMMARY OF THE INVENTION

A cleaning solution for cleaning copper-containing microelectronic substrates comprises a quaternary ammonium hydroxide selected from the group consisting of tetramethylammonium hydroxide, tetraethylammonium hydroxide, trimethylethylammonium hydroxide, and combinations thereof; an organic amine selected from the group consisting of monoethanolamine, aminoethylethanolamine, -methylaminoethanol, aminoethoxyethanol, diethanolamine, triethanolamine, $C_1$–$C_5$ alkanolamines, and combinations thereof; a corrosion inhibitor selected from the group consisting of gallic acid, catechol, pyrogallol, resorcinol, hydroquinone, benzotriazole, and combinations thereof; and water. The pH of the solution is greater than 10.

A cleaning solution for cleaning copper-containing microelectronic substrates comprises a) tetramethylammonium hydoxide, b) monoethanolamine, c) gallic acid, and deionized water. The pH of the solution is greater than 10. Preferably, tetramethylammonium hydroxide is in the cleaning solution in an amount in the range from about 0.15 wt % to about 1.25 wt %, monoethanolamine is in the solution in an amount in the range from about 0.4 wt % to about 2.25 wt %, and gallic acid is in the solution in an amount in the range from about 0.09 wt % to about 0.9 wt %.

A concentrate composition for a cleaning solution for cleaning copper-containing microelectronic substrates in also provided. The concentrate composition comprises tetramethylammonium hydroxide in an amount in the range from about 8.0 wt % to about 12.4 wt %, monoethanolamine in an amount in the range from about 14.4 wt % to about 27.8 wt %, gallic acid in an amount in the range from about 5.6 wt % to about 10.9 wt %, and the balance deionized water. A cleaning solution is provided comprising the concentrate in an amount in the range from about 1.5 wt % to about 12.5 wt % in the cleaning solution.

DETAILED DESCRIPTION OF THE INVENTION

Figure 1:
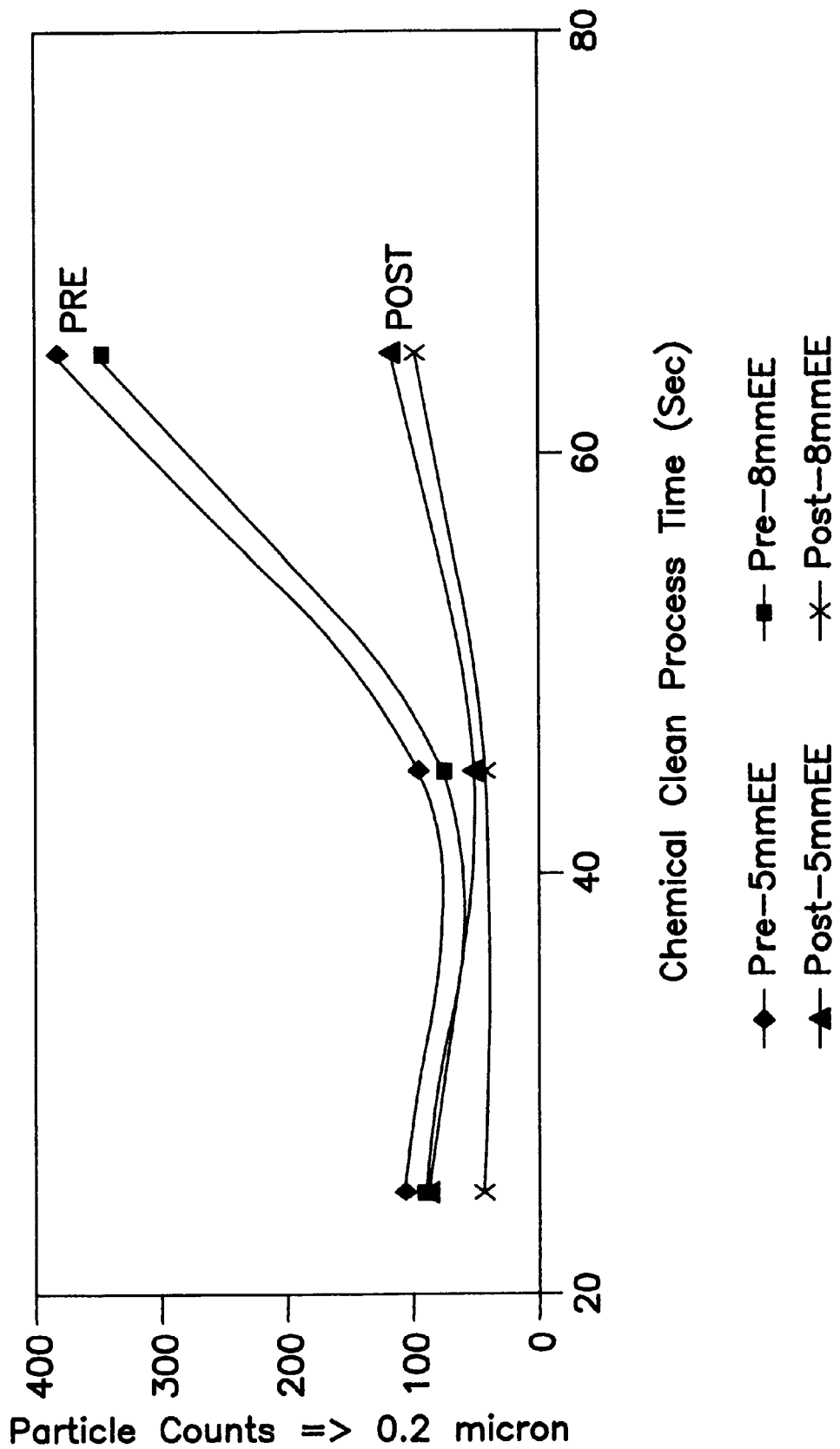
FIG. 1 is a graph illustrating the relationship between particle counts measured from wafers cleaned with a cleaning solution of the invention and process cleaning time.

A cleaning solution for cleaning copper-containing microelectronic substrates following CMP processing is provided. Cleaning copper-containing substrates following CMP processing is generally referred to as "post-Cu CMP" or "post-CMP copper clean". A "copper-containing microelectronic substrate" is understood herein to refer to a substrate surface manufactured for use in microelectronic, integrated circuit, or computer chip applications, wherein the substrate contains copper-containing components. Copper-containing components may include, for example, metallic interconnects that are predominately copper or copper alloy. It is understood that the microelectronic surface may also be composed of semiconductor materials, such as TiN, Ta, TiW (as copper diffusion barrier metals), and silica. Generally, a copper-containing microelectronic substrate contains about 1–20% Cu, including the copper interconnects.

The cleaning solution of the invention may find application for any cleaning operation during the fabrication of microelectronic substrates, such as semiconductor wafers. Most notably, such cleaning applications include post-Via formations and post-CMP processes. The fabrication of conventional semiconductor wafers entails many steps requiring planarization, followed by the removal of residual product from the planarization process.

The cleaning solution of the invention comprises a quaternary ammonium hydroxide, an organic amine, a corrosion inhibitor, and the balance water. The quaternary ammonium hydroxide is selected from the group consisting of tetramethylammonium hydroxide, tetraethylammonium hydroxide, tetrapropylammonium hydroxide, trimethylethylammonium hydroxide, and combinations thereof. Quaternary ammonium hydroxide is present in the solution in an amount from about 0.15 wt % to about 1.75 wt %.

The organic amine is selected from the group consisting of monoethanolamine, aminoethylethanolamine, methylaminoethanol, aminoethoxyethanol, diethanolamine, triethanolamine, $C_1$–$C_5$ alkanolamines, and combinations thereof. Organic amine is present in the solution in an amount from about 0.4 wt % to about 2.75 wt %.

The corrosion inhibitor is selected from the group consisting of gallic acid, catechol, pyrogallol, resorcinol, hydroquinone, benzotriazole, and combinations thereof. Corrosion inhibitor is present in the solution in an amount from about 0.09 wt % to about 1.0 wt %.

The pH of a cleaning solution of the invention is greater than 10.

In a preferred embodiment of the cleaning solution of the invention, the cleaning solution comprises tetramethylammonium hydroxide ("TMAH"), monoethanolamine ("MEA"), gallic acid, and water. Most preferably, TMAH is present in the solution in an amount in the range from about 0.15 wt % to about 1.25 wt %; MEA is present in the solution in an amount in the range from about 0.4 wt % to about 2.25 wt %; gallic acid is present in the solution in an amount in the range from about 0.09 wt % to about 0.9 wt %; and the balance water.

The constituents of the cleaning solution of the invention may be mixed together in any order. The order of addition is exemplified with respect to the preferred embodiment containing TMAH, MEA, gallic acid, and water. In a preferred method of preparation, 50% of the water in the final solution is added to all of the MEA, followed by addition of the gallic acid. The remaining 50% of water is added when the gallic acid is dissolved. The TMAH is then added and the composition mixed under low shear-stress conditions for about 10 minutes. The resulting mixture is then filtered through a 0.1 micron filter.

The components of the preferred embodiment cleaning solution of the invention are commercially available.

An important feature of the cleaning solution of the invention is that the non-aqueous constituents (the constituents other than water) are present in the solution in comparatively smaller quantities than prior art cleaning solutions. A cleaning solution of the invention is therefore more "dilute" than prior art post-CMP cleaning solutions. This is an economic advantage since an effective cleaning solution can be formulated more cheaply, which is of importance since such post-CMP cleaning solutions are used in large quantities.

In an alternative embodiment of the invention, a concentrated composition is provided that may be diluted to be used as a cleaning solution. A concentrated composition of the invention, or "concentrate", advantageously permits a CMP process engineer, for example, to dilute the concentrate to the desired strength and pH. A concentrate also permits longer shelf life, and easier shipping and storage of the product.

A concentrate of the invention preferably comprises TMAH in an amount in the range from about 8.0 to about 12.4 wt %, MEA in an amount in the range from about 14.4 to about 27.8 wt %, gallic acid in an amount in the range from about 5.6 to about 10.9 wt %, and the balance water (preferably deionized water).

A concentrate of the invention is preferably diluted for use in post-CMP cleaning applications by adding deionized water until the concentrate is from about 1.5 wt % to about 12.5 wt % of the prepared cleaning solution.

The cleaning solution of the invention may be employed for cleaning microelectronic substrates at temperatures ranging from ambient conditions to about 70° C. It is generally recognized that cleaning improves as temperature increases. At temperatures greater than about 70° C., evaporation of constituent cleaning solution species risks adversely altering the chemistry of the cleaning system over time in a process open to ambient conditions.

The cleaning solution of the invention, as noted, has a pH greater than 10. More preferably, the pH of a cleaning solution of the invention is maintained in the range from about 11.0 to about 12.2. A pH greater than 10 is necessary to obtain a negative zeta potential on the surface of the substrate and the remaining particulates during the cleaning operation.

The cleaning solution of the invention meets generally accepted industry cleaning performance standards for post-CMP applications. A common industrial cleaning target is a particle count on the substrate wafer of less than 20 particles greater than 0.2 microns in size for a 200 mm wafer, with a 5 mm edge exclusion.

The cleaning solution of the invention limits copper corrosion to smoothing of the surface and does not damage processing equipment.

The cleaning solution of the invention may be used with a large variety of conventional cleaning tools, including Verteq single wafer megasonic Goldfinger, OnTrak systems, DDS (double-sided scrubbers) and Megasonic batch wet bench systems.

The cleaning solution of the invention may be used successfully on surfaces containing copper, tungsten, and/or silica.

Via cleaning is one application of the cleaning solution of the invention. Vias are holes etched in microelectronic substrates to provide a conduit for connecting metal layers. Etching the substrate surface with a gaseous etchant forms Vias. The substrate is commonly a dielectric material, such as Fluorinated Silica Glass (FSG). The residue remaining on the substrate surface and Via walls must be removed following the etching process. The residue is often referred to as "side wall polymer", as it is also found on the vertical walls of the Via. Etching residue may also be located at the bottom of the Via, on top of the metal. The cleaning solution of the invention does not react with or affect the exposed dielectric material.

The following Examples are merely illustrative of the invention and are not intended to be limiting.

EXAMPLE 1

The performance of a post-Cu CMP cleaning solution of the invention was compared to the performance of prior art, commercially available post-Cu CMP cleaning solutions.

Sample 200 mm TEOS wafers (non-copper containing) were pre-cleaned using a scrubber. Defects were measured on a Tencor 6400; all wafers had<100 defects at 0.2 µm. Three separate series of performance tests were conducted using a different commercially-available CMP slurry composition to contaminate the wafers:

series I: Cabot 5001 (as first step slurry)
series II: Cabot 4200 (as second step slurry)
series III: Cabot SS25 (an oxide slurry)

Each of the three slurries are available from Cabot Corporation (Boston, Mass.). The Cabot 5001 and 4200 slurries were prepared with the recommended amount of hydrogen peroxide per labeling instructions. Tests were conducted within 24 hours of the slurry's preparation.

The sample wafers were first immersed into a solution of deionized water and surfactant (Wako NCW-601 A), then 500 ml of CMP slurry. The wafers were individually dipped in the slurry for 10 sec., dipped again in the water/surfactant solution, then processed through an SRD (Spin Rinse Dry cycle) at 1300 rpm to 5 min., without heat, to dry the wafers.

Post-CMP cleaning solutions were prepared as follows:

Solution A: Cabot 101 (Cabot Corp.)

Solution B: EKC CMPC5000 (EKC Corp.), 20:1 dilution

Solution C: buffered oxalic acid, pH=5.35

Solution D: deionized water, ammonium hydroxide (100:1 dilution), and a surfactant (ammonium peroxide/ acetic acid)

| Solution E: | TMAH | 0.5 wt % |
|---|---|---|
| | MEA | 0.9 wt % |
| | gallic acid | 0.35 wt % |
| | deionized water | 98.25 wt % (pH = 12.3–12.6) |

Solution F: Solution E, further containing 0.2 wt % of a surfactant (Surfynol 420; Air Products)

The post-CMP cleaning solutions were evaluated for slurry removal using a process time of 38 sec. on a Goldfinger GFS-CMP-200C module without rotation. Megasonic agitation was employed. Static tests measure the strength of cleaning ability unaided by any other mechanical energy.

The wafers were then scanned at 0.2 µm using a Tencor 6400 and a clean angle was measured. A "clean angle" is the angle formed by the delineated appearance of a clean wafer on both sides of the megasonic wand; the greater the measured clean angle, the more effective is the cleaning solution.

The results are shown in Table I.

TABLE I

STATIC TEST-MULTIPLE SLURRY CONTAMINATION

| Slurry →<br>Solution ↓ | Cabot<br>5001<br>(clean angle, degrees) | Cabot<br>4200<br>(clean angle, degrees) | Cabot<br>SS25<br>(clean angle, degrees) |
|---|---|---|---|
| A | 82 | 70 | 62 |
| B | <5 | <1 | 17 |
| C | 79 | 66 | 47 |
| D | 70 | <1 | 49 |
| E | 86 | 110 | 101 |
| F | 74 | 83 | N/A |

The results indicate that a post-Cu CMP cleaning solution of the invention (solution E) performed better during static wafer tests than post-CMP cleaning solutions of the prior art. The performance of solution E in removing CMP residuum was demonstrably more significant in series II and series III, as evidenced by clean angles measured at greater than 100 degrees. It should be noted that one skilled in the art would recognize that measured clean angles differing in only several degrees represent a significant difference in performance. The results also indicate that the inclusion of certain surfactant in a cleaning solution of the invention (solution F) does not enhance the performance of the cleaning solution in a static test.

EXAMPLE 2

The post-CMP cleaning solutions (A–F) of Example I were evaluated in a static test as in Example 1, except that the sample wafers were dipped in all three CMP slurries (series I, II and III) consecutively, then dipped into one of the cleaning solutions A–F.

The results are shown in Table II.

TABLE II

STATIC TEST - MULTIPLE SLURRY CONTAMINATION

| Solution | Cabot 5001/4200/SS25 (cleaning angle, degrees) |
|---|---|
| A | 23 |
| B | 24 |
| C | 44 |
| D | 63 |
| E | 79 |
| F | 34 |

The results indicate that a post-CMP cleaning solution of the invention (solution E) performed better than cleaning solutions of the prior art, as evidenced by the greater cleaning angle measured.

EXAMPLE 3

The multiple slurry contamination test of Example 2 was again conducted, but under dynamic cleaning conditions. That is, the subject wafer was rotated at 200 rpm during cleaning solution application (and mega-sonic agitation) on the Goldfinger GFS-CMP-200C. Particle counts were measured using the Tencor 6400.

The results are shown in Table III.

TABLE III

DYNAMIC TESTS - MULTIPLE SLURRY CONTAMINATION

| Solution | 38 sec. Process Time (particle count) | 190 sec. Process Time (particle count) |
|---|---|---|
| A | 18,665 | N/A |
| B | 30,000 | 1,614 |
| C | 16,097 | 8,949 |
| D | 1,966 | 810 |
| E | 19,512 | 491 |
| F | 26,856 | 405 |

The results indicate that a post-CMP cleaning solution of the invention performed significantly better than cleaning solutions of the prior art, as evidenced by the lower particle counts achieved at a 190 sec. process time.

EXAMPLE 4

Tests were conducted to evaluate the relative cleaning performance of post-CMP cleaning solutions of varying composition. Cleaning solutions were prepared by mixing deionized water TMAH, gallic acid, and one of three amine compounds (MEA, hydroxylamine, or N-monoethanolamine). The composition of the prepared cleaning solutions is set forth in Table IV. For purposes of comparison, two additional cleaning solutions were prepared: Solution K was 1.7 wt % $NH_4OH$ in deionized water and Solution L was 1:2:10 $NH_4OH:H_2O_2:H_2O$. The pH of each cleaning solution was measured.

"Dip tests" were conducted using precleaned Fisher 12-550-10 glass microscope slides. In the following procedures, all dips were undertaken for 5 sec., and handled with plastic forceps. A sample slide was first dipped into a CMP oxide slurry (Ultraplane P-1500), then dipped into 250 ml of deionized water, and then into a W-CMP slurry (1:1 dilution of Ultraplane-MC W CMP base and deionized water). Each slide was then dipped into 250 ml deionized water, then into the subject cleaning solution. Each slide was then dipped into 100 ml deionized water, then dipped into another separate deionized water bath. The slides were hung to air dry under ambient conditions. Between each test, all deionized water baths were replaced.

Dried slides were visually evaluated for evidence of remaining CMP slurry, as evidenced by the degree of cloudiness observed on the slide. The dried slides were compared and ranked from best to worst.

The results are shown in Table IV.

TABLE IV

COMPARATIVE DIP TEST

| | Amine | TMAH (wt %) | Amine (wt %) | Gallic Acid (wt %) | pH | Relative Rank |
|---|---|---|---|---|---|---|
| A | MEA | 0.5 | 0.9 | 0.2 | 12.14 | 1 |
| B | MEA | 0.5 | 0.9 | 0.35 | 11.64 | 2 |
| C | HA | 0.5 | 0.45 | 0.2 | 12.02 | 3 |
| D | NMEA | 0.5 | 0.9 | 0.35 | 11.67 | 4 |
| E | MEA | 0.5 | 0.9 | 0.1 | 12.37 | 5 |
| F | HA | 0.66 | 0.3 | 0.233 | 12.2 | 6 |
| G | HA | 0.66 | 0.6 | 0.233 | 12.17 | 7 |
| H | HA | 0.33 | 0.3 | 0.467 | 8.73 | 8 |
| J | HA | 0.33 | 0.6 | 0.467 | 8.72 | 9 |
| K | — | — | — | — | 9.37 | 10 |
| L | — | — | — | — | 10.19 | 11 |

The results indicate that preferred embodiments of the invention performed best (solutions A and B). All solutions of the invention performed better then cleaning solutions of the prior art (solutions K and L).

EXAMPLE 5

The cleaning solutions prepared in accordance with Example 4 were evaluated for the tendency to corrode copper. Copper strips were weighed, then placed in 200 ml of the subject cleaning solution for 20 hours under ambient conditions. The copper strips were thereafter removed from the cleaning solution, rinsed with deionized water, and dried. The cleaning solution was visually inspected for color change. The copper strips were visually inspected for color changes and weighed. Color changes are evidence of corrosion.

The results are set forth in Table V.

TABLE V

CU-STRIP CORROSION TESTS

| Solution | wt loss (g) | Cu Strip appearance |
|---|---|---|
| A | 0.018 | light, bright; not as good as B |
| B | 0.025 | light, bright; not as good as D |
| C | 0.022 | darkened |
| D | 0.051 | light and bright |
| E | 0.012 | darkened |
| F | 0.026 | darkened |
| G | 0.031 | darkened |
| H | 0.013 | darkened |
| J | 0.092 | darkened |
| K | 0.06 | darkened |
| L | 0.062 | blue-green severe |

The results indicate that preferred embodiments of the invention (solutions A and B) performed very well. Some of the solutions of the invention caused the copper strip to darken, probably due to the length of the test period (20 hours).

EXAMPLE 6

A series of cleaning solutions were prepared to evaluate the relationship between TMAH, MEA, and gallic acid in aqueous cleaning solutions. Cleaning solutions were prepared by combining TMAH, MEA, gallic acid, and deionized water such that the concentration of TMAH was either 0.75 wt %, 0.5 wt %, or 0.25 wt %; the concentration of MEA was either 1.8 wt %, 0.9 wt %, or 0 wt %; the concentration of gallic acid was either 0.7 wt %, 0.35 wt %, or 0 wt %; and the balance deionized water in each case. Nine test solutions were prepared as set forth in Table VI. The prepared cleaning solutions were evaluated for cleaning performance according to the glass slide dip test procedure set forth in Example 4. The prepared cleaning solutions were also evaluated for tendency to corrode copper according to the copper strip test procedure of Example 5.

The results are shown in Table VI.

TABLE VI

|  | 1 | 2 | 3 | 4 | 5 | 6 | 7 | 8 | 9 |
|---|---|---|---|---|---|---|---|---|---|
| TMAH (wt %) | 0.75 | 0.25 | 0.25 | 0.75 | 0.25 | 0.75 | 0.25 | 0.5 | 0.75 |
| MEA (wt %) | 0 | 0 | 0 | 1.8 | 1.8 | 1.8 | 1.8 | 0.9 | 0 |
| Gallic Acid (wt %) | 0 | 0.7 | 0 | 0.7 | 0 | 0 | 0.7 | 0.35 | 0.7 |
| Water (wt %) | 99.25 | 99.05 | 99.75 | 96.75 | 97.95 | 97.45 | 97.25 | 98.25 | 98.55 |
| pH | 12.67 | 4.83 | 12.17 | 11.13 | 12.18 | 12.67 | 10.25 | 11.61 | 10.77 |
| Relative Rank- dip test | 6 | 9 | 3 | 1 | 8 | 4 | 5 | 2 | 7 |
| wt loss (g)- Cu- corrosion test | 0.004 | 0 | 0 | 0.032 | 0.009 | 0.007 | 0.03 | 0.023 | 0.018 |
| Cu- | blacken- | dark | darken- |  |  |  |  |  |  |

The results indicate that the solutions that performed best as cleaning agents in the dip test (solutions 4 and 8) contained TMAH, MEA, and gallic acid. Solutions not containing at least one of these constituents did not perform as well. The results suggest a synergistic cleaning effect is present when TMAH, MEA, and gallic acid co-exist in a cleaning solution, particularly in the preferred amounts.

EXAMPLE 7

The effectiveness of a TMAH/MEA/gallic acid cleaning solution of the invention was evaluated. PTEOS wafers (300 mm) were measured for particle counts (particles≧0.2 micron), prior to CMP treatment. The wafers were then polished for 45 seconds using Cabot EPC4200 slurry on a Strasbaugh Symphony CMP tool. Sample wafers were then cleaned on a Verteq Goldfinger apparatus using a cleaning solution of the invention (20:1 dilution in deionized water of a concentrate prepared from 10% TMAH, 18% MEA, 7% gallic acid, and the balance deionized water). Sample wafers were cleaned for time periods of 25 sec., 45 sec., or 65 sec. After cleaning, particle counts (particles≧0.2 micron) were acquired. All particle counts were determined on a Tencor 6420 particle counter at 5 mm and 8 mm edge exclusions (EE).

The results are shown in FIG. 1. Particle counts are reported for "pre" CMP/cleaning operations and for "post" CMP/cleaning operations. The results indicate that particle counts, by virtue of the cleaning process using a cleaning solution of the invention, were lowered below "pre" CMP/cleaning levels.

In certain applications, the cleaning solutions of the present invention, when used on copper wafers, have a tendency to etch the copper surface by a corrosion process. This mild attack on the surface may be beneficial in that it greatly promotes the removal of unwanted particles.

For those applications where slight corrosion of the copper surface is to be avoided, the cleaning solution may be modified to reduce or eliminate corrosion by one or both of the following:
 (a) dilution of the cleaning solution with deionized water so that the concentrate is present at about 1.5 wt % in the cleaning solution.
 (b) using corrosion inhibitor gallic acid in combination with corrosion inhibitor benzotriazole; this combination of inhibitors works synergistically, and lower than ordinary concentrations are effective.

It is further understood that the present invention is not limited to the particular embodiments shown and described herein, but that various changes and modifications may be made without departing from the scope and spirit of the invention.

What is claimed is:

1. A post-CMP cleaning solution for cleaning microelectronic substrates, the cleaning solution comprising:
 0.15 to 1.75% by weight of a quaternary ammonium hydroxide selected from the group consisting of tetramethylammonium hydroxide, tetraethylammonium hydroxide, trimethylethylammonium hydroxide, and combinations thereof;
 0.4 to 2.75% by weight of an organic amine selected from the group consisting of monoethanolamine, aminoethylethanolamine,-methylaminoethanol, aminoethoxyethanol, diethanolamine, triethanolamine, $C_1$–$C_5$ alkanolamines, and combinations thereof;
 0.09 to 1.0% by weight of a corrosion inhibitor selected from the group consisting of gallic acid, catechol, pyrogallol, resorcinol, hydroquinone, benzotriazole, and combinations thereof;

balance deionized water;

wherein the pH of the solution is greater than 10.

2. A post-CMP cleaning solution for cleaning microelectronic substrates, the cleaning solution comprising:
 a. 0.15 to 1.25% by weight tetramethylammonium hydroxide;
 b. 0.4 to 2.25% by weight monoethanolamine;
 c. 0.09 to 0.9% by weight gallic acid;
 d. balance deionized water,
 wherein the pH of the solution is greater than 10.

3. The cleaning solution of claim 2, wherein the pH of the solution is in the range from about 11.0 to about 12.2.

4. The cleaning solution of claim 1 wherein said corrosion inhibitor is comprised of a combination of gallic acid and benzotriazole.

5. A post-CMP cleaning solution for cleaning microelectronic substrates, comprising:
 1.5 to 12.5 wt % of a concentrate consisting essentially of
  tetramethylammonium hydroxide, in an amount in the range from about 8.0 wt % to about 12.4 wt %;
  monoethanolamine, in an amount in the range from about 14.4 wt % to about 27.8 wt %;
  gallic acid, in an amount in the range from about 5.6 wt % to about 10.9 wt %;
  balance deionized water and;
 87.5 to 98.5 wt % deionized water.

6. A method for preparing a post-CMP cleaning solution containing 0.15 to 1.25 wt % tetramethylammonium hydroxide, 0.4 to 2.25% by weight monoethanolamine, 0.09 to 0.9% by weight gallic acid balance deionized water comprising the steps of:
 a) preparing a mixture of one-half of the total final concentration of water and said monoethanolamine;
 b) adding said gallic acid to said water and methanolamine mixture;
 c) adding the balance of the water to said gallic acid-water-methanolamine mixture and mixing with said gallic acid is described;
 d) adding said tetramethylammonium hydroxide to said water-gallic acid-methanolamine mixture and mixing with low shear conditions to achieve a final mixture; and
 e) filtering said final mixture through a 0.1 micron filter.

7. A method according to claim 6, including conducting said mixing step for at least about ten minutes.

8. A method according to claim 6, including the step of adjusting pH of said cleaning solution to greater than 11.

9. A post-CMP cleaning solution according to claim 1, wherein said pH is greater than 11.

* * * * *